(12) United States Patent
Gan et al.

(10) Patent No.: US 11,348,866 B2
(45) Date of Patent: May 31, 2022

(54) PACKAGE AND LEAD FRAME DESIGN FOR ENHANCED CREEPAGE AND CLEARANCE

(71) Applicant: Infineon Technologies Austria AG, Villach (AT)

(72) Inventors: Thai Kee Gan, Melaka (MY); Edward Fuergut, Dasing (DE); Teck Sim Lee, Melaka (MY); Lee Shuang Wang, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/902,487

(22) Filed: Jun. 16, 2020

(65) Prior Publication Data

US 2021/0391246 A1    Dec. 16, 2021

(51) Int. Cl.
*H01L 23/498* (2006.01)
*H01L 23/31* (2006.01)

(52) U.S. Cl.
CPC .... *H01L 23/49844* (2013.01); *H01L 23/3107* (2013.01)

(58) Field of Classification Search
CPC ...................... H01L 23/49844; H01L 23/3107
See application file for complete search history.

(56) References Cited

U.S. PATENT DOCUMENTS

| | | | |
|---|---|---|---|
| 9,041,172 B1 | 5/2015 | Niu et al. | |
| 2017/0025336 A1 | 1/2017 | Padmanabhan et al. | |
| 2018/0040540 A1* | 2/2018 | Kasuya | H02P 6/12 |
| 2018/0109249 A1 | 4/2018 | Suh et al. | |
| 2019/0115291 A1 | 4/2019 | Chen | |
| 2019/0165591 A1 | 5/2019 | Kisacikoglu et al. | |
| 2019/0252307 A1* | 8/2019 | Kawashima | H01L 23/051 |
| 2019/0279961 A1* | 9/2019 | Iwasaki | H01L 23/49575 |
| 2020/0273810 A1* | 8/2020 | Saklang | H01L 23/528 |
| 2020/0343166 A1* | 10/2020 | Bonifacio | H01L 25/50 |
| 2021/0202365 A1* | 7/2021 | Milo | H01L 23/49838 |
| 2021/0233871 A1* | 7/2021 | Kaizu | B23K 35/30 |
| 2021/0265310 A1* | 8/2021 | Kikuchi | H01L 23/544 |

FOREIGN PATENT DOCUMENTS

| | | |
|---|---|---|
| CN | 206312886 U | 7/2017 |
| JP | 2002118220 A | 4/2002 |

* cited by examiner

*Primary Examiner* — Nathan W Ha

(74) *Attorney, Agent, or Firm* — Murphy, Bilak & Homiller, PLLC

(57) ABSTRACT

A lead frame includes a die pad, a row of two or more leads that extend away from a first side of the die pad, and a peripheral structure disposed opposite the die pad and connected to each lead. A first outermost lead is continuously connected to the die pad. A second outermost lead has an interior end that faces and is spaced apart from the die pad. A width of the second lead in a central span of the second lead is greater than the width of the second lead in interior and outer spans of the second lead, the interior span of the second lead separating the central span of the second lead from the interior end of the second lead, the outer span of the second lead separating the central span of the second lead from the peripheral structure.

20 Claims, 2 Drawing Sheets

PACKAGE AND LEAD FRAME DESIGN FOR ENHANCED CREEPAGE AND CLEARANCE

TECHNICAL FIELD

The instant application relates to semiconductor packaging, and more particularly to lead frame designs for discrete device packages.

BACKGROUND

High voltage semiconductor devices such as MOSFETs (metal oxide semiconductor field effect transistors) or IGBTs (insulated gate bipolar transistors) are commonly packaged in a molded semiconductor package that includes a number of through-hole configured leads protruding out of the encapsulant body. Important design considerations for these types of packages include creepage and clearance. Creepage refers to the shortest path between two package leads along the surface of an isolating structure between the two leads, e.g., a sidewall of the encapsulant body. Clearance refers to the shortest path between two package leads in a direct line, e.g., through air. Maintaining high creepage and clearance is particularly important between two package leads that accommodate a large voltage difference, e.g., between the source and drain leads of a high voltage MOSFET device. However, increasing creepage and clearance conflicts with an overall desire to make semiconductor packages as small as possible. Furthermore, some high voltage rated semiconductor devices include additional terminals that are used to finely tune the operation of the device for optimum performance. Examples of these terminals include source sense terminals, gate terminals, temperature sense terminals, etc. These additional terminals require another package lead, thus impacting the maximum possible creepage and clearance between the voltage blocking leads of the device.

SUMMARY

Those skilled in the art will recognize additional features and advantages upon reading the following detailed description, and upon viewing the accompanying drawings.

A lead frame is disposed. According to an embodiment, the lead frame comprises a die pad comprising a die attach surface, a row of two or more leads that extend away from a first side of the die pad, and a peripheral structure disposed opposite the first side of the die pad and connected to each lead from the row of two or more lead. A first outermost lead of the row is continuously connected to the first side of the die pad. A second outermost lead of the row comprises an interior end that faces and is spaced apart from the first side of the die pad. A width of the second lead in a central span of the second lead is greater than the width of the second lead in an interior span of the second lead and in an outer span of the second lead, the interior span of the second lead separating the central span of the second lead from the interior end of the second lead, the outer span of the second lead separating the central span of the second lead from the peripheral structure.

Separately or combination, the second lead comprises an inner edge side that faces the first lead and extends from the interior end of the second lead to the peripheral structure, the inner edge side of the second lead is closer to the first lead in the central span of the second lead than in the interior and outer spans of the second lead.

Separately or combination, in the central span of the second lead, the inner edge side of the second lead comprises a central edge and first and second angled edges, and the central edge of the second lead is a closest surface of the second lead to the first lead.

Separately or combination, the row of leads comprises a third lead that is immediately adjacent to the second lead and comprises an interior end that faces and is spaced apart from the first side of the die pad, the third lead comprises an angled span disposed between interior and outer spans of the third lead, the interior span of the third lead separating the angled span from the interior end of the third lead, the angled span is disposed closer to the die pad than the central span of the second lead, and the angled span shifts the third lead away from the second lead.

Separately or combination, an angled width of the third lead in the angled span is no greater than 1.5 times the width of the third lead in the interior span, the angled width being measured in a direction that is perpendicular an outer edge side of the third lead in the angled span.

Separately or combination, a width of the first lead tapers incrementally moving from the die pad towards the peripheral structure.

Separately or combination, the first lead comprises an interior span, a central span, and an outer span, the interior span of the first lead separating the central span of the first lead from the die pad, the outer span of the first lead separating the central span of the first lead from the distal end of the first lead, the interior span of the first lead is wider than the central span of the first lead, and the central span of the first lead is wider than the outer span of the first lead.

Separately or combination, the first lead comprises an inner edge side that faces the second lead and extends from the die pad to the peripheral structure, the inner edge side of the first lead is closer to the second lead in the interior span of the first led than in the central span of the first lead, and the inner edge side of the first lead is closer to the second lead in the central span of the first lead than in the outer span of the first lead.

A semiconductor package is disclosed. According to an embodiment, the semiconductor package comprises a die pad comprising a die attach surface, a first semiconductor die mounted on the die attach surface, an encapsulant body of electrically insulating mold compound that encapsulates the first semiconductor die and comprises first, second and third outer faces, the first outer face extending between the second and third outer faces, and a row of two or more leads that extend away from a first side of the die pad and protrude out of the first outer face. A first outermost lead of the row is continuously connected to the first side of the die pad. A second outermost lead of the row comprises an interior end that faces and is spaced apart from the first side of the die pad. A width of the second lead in a central span of the second lead is greater than the width of the second lead in an interior span of the second lead and in an outer span of the second lead, the interior span of the second lead separating the central span of the second lead from the interior end of the second lead, the outer span of the second lead separating the central span of the second lead from a distal end of the second lead.

Separately or in combination, the second lead comprises an inner edge side that faces the first lead and extends from the interior end to the distal end of the second lead, the inner edge side of the second lead is closer to the first lead in the central span of the second lead than in the interior and outer spans of the second lead.

Separately or in combination, in the central span of the second lead, the inner edge side of the second lead comprises a central edge and first and second angled edges, and the central edge of the second lead is a closest surface of the second lead to the first lead.

Separately or in combination, the row of leads comprises a third lead that is immediately adjacent to the second lead and comprises an interior end that faces and is spaced apart from the first side of the die pad, the third lead comprises an angled span disposed between an interior span and an outer span of the third lead, the interior span of the third lead separating the angled span from the interior end of the third lead, and the angled span is disposed closer to the die pad than the central span of the second lead, and the angled span shifts the third lead away from the second lead.

Separately or in combination, the semiconductor package further comprises first and second bond wires, both of the first and second bond wires are electrically connected to the second lead.

Separately or in combination, the semiconductor package further comprises a second semiconductor die mounted on the die attach surface, the first bond wire electrically connects the second lead to the first semiconductor die, and the second bond wire electrically connects the second lead to the second semiconductor die.

Separately or in combination, each of the first and second semiconductor dies is configured as a power transistor, and the second lead is configured as a control terminal of the semiconductor package.

Separately or in combination, the row of two or more leads comprises a third lead that protrudes out of the first outer wall and is immediately adjacent to the second lead, and the third lead is configured as a sensing terminal of the semiconductor package.

Separately or in combination, the row of two or more leads comprises a fourth lead that protrudes out of the first outer wall and is immediately adjacent to the first lead, the first and fourth leads are configured as voltage blocking terminals of the semiconductor package, and the encapsulant body further comprises an indentation in the first outer wall between the first and fourth leads.

According to another embodiment, the semiconductor package comprises a die pad comprising a die attach surface, a first semiconductor die mounted on the die attach surface, an encapsulant body of electrically insulating mold compound that encapsulates the first semiconductor die and comprises first, second and third outer faces, the first outer face extending between the second and third outer faces, and a row of two or more leads that extend away from a first side of the die pad and protrude out of the first outer face. A first outermost lead of the row is continuously connected to the first side of the die pad. A second outermost lead of the row comprises an interior end that faces and is spaced apart from the first side of the die pad. A width of the first lead tapers incrementally moving from the die pad towards a distal end of the first lead.

Separately or in combination, the first lead comprises an interior span, a central span, and an outer span, the interior span of the first lead separating the central span of the first lead from the die pad, the outer span of the first lead separating the central span of the first lead from the distal end of the first lead, the interior span of the first lead is wider than the central span of the first lead, and the central span of the first lead is wider than the outer span of the first lead.

Separately or in combination, the first lead comprises an inner edge side that faces the second lead and extends from the die pad to the peripheral structure, the inner edge side of the first lead is closer to the second lead in the interior span of the first lead than in the central span of the first lead, and the inner edge side of the first lead is closer to the second lead in the central span of the first lead than in the outer span of the first lead.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments of a lead frame with an advantageous lead configuration and a corresponding semiconductor package is described herein. The lead frame includes a row of leads extending away from a first side of a die pad. The row of leads includes a first outermost lead at one side of the row and a second outermost lead at an opposite side of the row. The first outermost lead is continuously connected to the die pad, and may be configured as a drain terminal of the semiconductor package, for example. The second outermost lead is detached from the die pad, and may be configured as a gate terminal of the semiconductor package, for example. Both the first and second outermost leads have an advantageous multi-width configuration. Specifically, the width of the first outermost lead incrementally tapers moving away from the die pad. This tapered configuration provides mechanical support and stability to the die pad while simultaneously increasing the separation distance between the first outermost lead and the immediately adjacent lead, thereby improving creepage and clearance between the two. The width of the second outermost lead increases in a central span that is between an interior span and an outer span. This widened portion of the second outermost lead mitigates vibration of the second outermost lead during wire bonding. This allows for a narrowing of the interior portion of the second outermost lead, thereby improving creepage and clearance.

Figure 1:
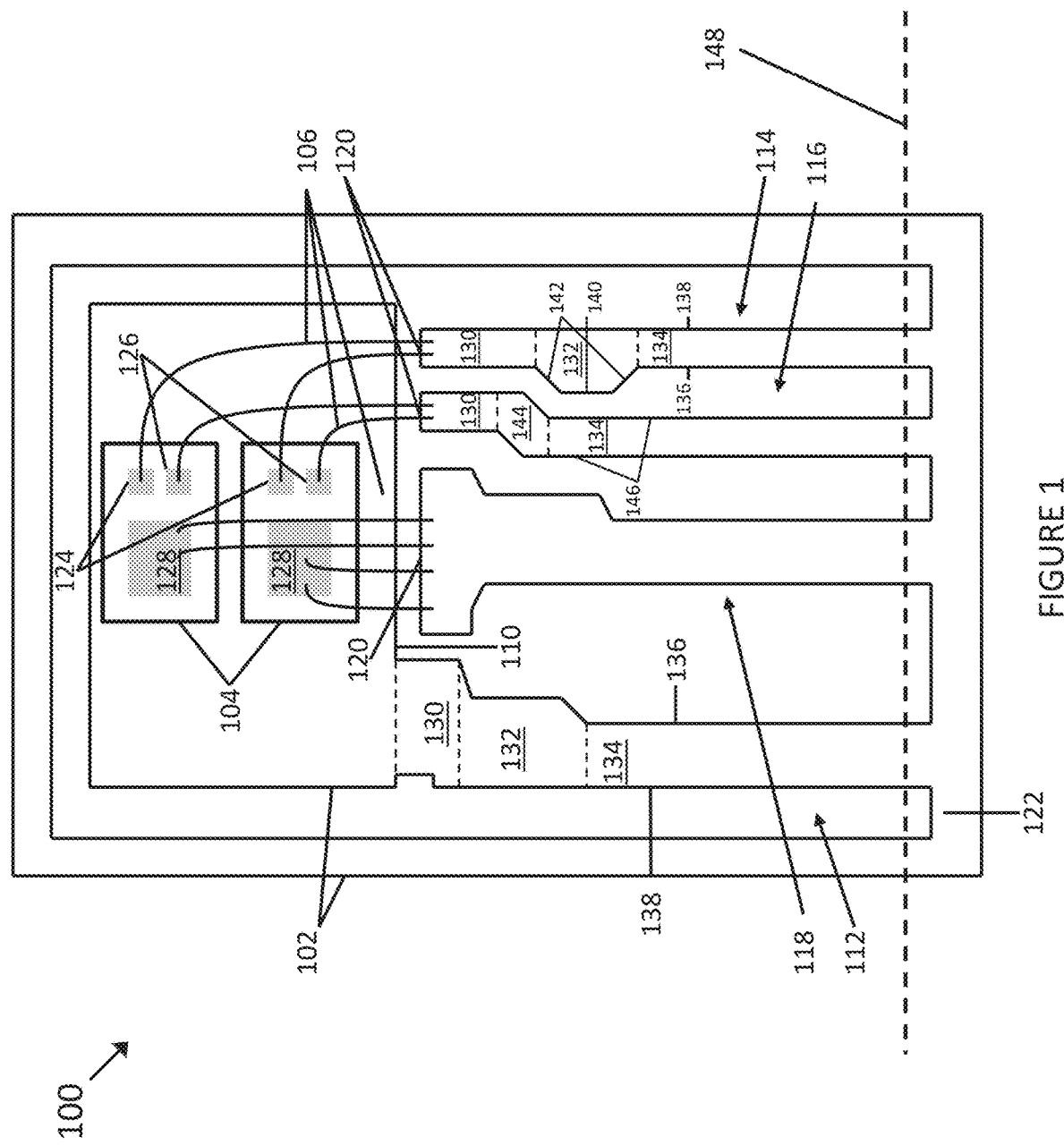
FIG. 1 illustrates a lead frame assembly for producing a semiconductor package, according to an embodiment.

Referring to FIG. 1, a lead frame assembly 100 is depicted, according to an embodiment. The lead frame assembly 100 is used to manufacture a molded semiconductor package. The lead frame assembly 100 includes a lead frame 102, two semiconductor dies 104, and a number of bond wires 106 forming electrical connections between the semiconductor die and the lead frame 102.

The lead frame 102 includes an electrically conductive material such as copper (Cu) Nickel, (nickel phosphorous) NiP, silver (Ag), palladium (Pd) gold (Au), etc., alloys or combinations thereof. According to one technique, the lead frame 102 is provided by a sheet of metal, and the various features of the lead frame 102 are formed by performing techniques such as stamping, punching, etching, bending, etc., on this planar sheet of metal.

The lead frame 102 includes a die pad 108 with a generally planar die attach surface that is dimensioned to accommodate the semiconductor dies 104. The lead frame 102 additionally includes a row of two or more leads that extend away from a first side 110 of the die pad 108. The row of leads includes a first lead 112 and a second lead 114. The first and second leads 112, 114 are outermost leads, meaning that these leads include an outer edge side that does not face any other leads from the row. In the depicted embodiment, the row of leads additionally includes a third lead 116 and a fourth lead 118 disposed between the first and second leads 112, 114. The third and fourth leads 116, 118 are interior leads, meaning that meaning that both outer edge sides of these leads face other leads from the row. The first lead 112 is continuously connected to the die pad 108. That is, the first lead 112 is directly attached or merges with the first side 110 of the die pad 108. The second, third and fourth leads 114, 116, 118 each include an interior end 120 that is spaced apart from the first side 110 of the die pad 108.

The lead frame 102 additionally includes a peripheral structure 122. The peripheral structure 122 is a handling feature for supporting and moving the lead frame 102 through the various processing tools that perform the semiconductor package assembly steps, e.g., die attach, wire bonding, encapsulation, etc. In the depicted embodiment, the peripheral structure 122 has a ring shape and the die pad 108 is centrally located inside of the ring. In other embodiments, the peripheral structure 122 may form a ring disposed only on one side of the die pad 108, and may include dam bars between two or more leads and/or spaced apart rails for handling and supporting the lead frame 102 during manufacture.

The semiconductor dies 104 may each include a lower surface terminal (not shown) that faces the die pad 108. The first lead 112 may be electrically connected to the lower surface terminals of the first and second semiconductor dies 104 via the die pad 108. To this end, a conductive adhesive, e.g., solder, sinter, conductive glue, diffusion solder, etc., may be provided between the rear side of the semiconductor dies 104 and the die attach surface. Additionally, the semiconductor dies 104 each include first, second and third upper surface terminals 124, 126, 128 that face away from the die pad 108. These upper surface terminals are electrically connected to the second, third and fourth leads 114, 116, 118 by the electrically conductive bond wires 106. Specifically, one of the bond wires 106 is connected between the second lead 112 and the first upper surface terminal 124 from each semiconductor die 106, one of the bond wires 106 is connected between the third lead 114 and the second upper surface terminal 126 from each semiconductor die 106, and two of the bond wires 106 are connected between the fourth lead 118 and the third upper surface terminal 128 from each semiconductor die 106.

According to an embodiment, the semiconductor dies 104 are each configured as power transistors, e.g., MOSFETs (Metal Oxide Semiconductor Field Effect Transistors) or Insulated Gate Bipolar Transistors (IGBT) configured to control large voltages, e.g., 200 volts or more, and/or accommodate large currents, e.g., 1 ampere or more. In this embodiment, the semiconductor dies 104 are connected in parallel with one another. In this example, the lower surface terminals of the semiconductor dies 104 can be the drain or collector terminals, the first upper surface terminals 124 can be the gate terminals, the second upper surface terminals 126 can be sensing terminals, and the third upper surface terminals 128 can be the source or emitter terminals. The sensing terminals are optional terminals used to finely tune the operation of the device. For example, the second upper surface terminal 126 can be a gate terminal that indicates a gate current of the device. In another example, the second upper surface terminal 126 can be a source sense terminal that indicates a source current of the device. In another example, second upper surface terminal 126 can be may be a temperature sense terminal that indicates the temperature of the semiconductor die.

More generally, the semiconductor dies 104 can have a variety of device configurations. For example, the semiconductor dies 104 can be configured as transistors, diodes, thyristors, etc. Moreover, the semiconductor dies 104 may have vertical device configurations and lateral device configurations. The lead frame 102 can be adapted to have a lead count commensurate with a particular device configuration. For example, in the case that the semiconductor die 104 is configured as a three-terminal device (e.g., a transistor without a sense terminal), the lead frame 102 can have a similar configuration as shown, but with the third lead 116 omitted. In the case that the semiconductor die 104 is configured as a two-terminal device (e.g., a diode), the lead frame 102 can have a similar configuration as shown, but with the third and fourth leads 116, 118 omitted. The lead frame assembly 100 may also be implemented with different numbers of dies. For instance, the lead frame assembly 100 may be used to package one, two, three, four, etc., semiconductor dies. The lead configuration of lead frame 102 may also be implemented in other taped of packages, such as intelligent power modules (IPMs), power modules (PMs), dual inline packages (DIPs) or surface mounted power packages (SMDs).

The first lead 112 has a width that tapers incrementally moving from the die pad 108 towards the peripheral structure 122. That is, the first lead 112 includes distinguishable spans that get progressively narrower moving away from the die pad 108. In the depicted embodiment, the first lead 112 includes an interior span 130, a central span 132, and an outer span 134. The interior span 130 of the first lead 112 separates the central span 132 of the first lead 112 from the die pad 108, and the outer span 134 of the first lead 112 separates the central span 132 from the peripheral structure 122. The interior span 130 of the first lead 112 is wider than the central span 132 of the first lead 112, and the central span 132 of the first lead 112 is wider than the outer span 134 of the first lead 112. Generally speaking, the width of the first lead 112 in the interior span 130 can be between about 1.25 to 1.75 times the width of the first lead 112 in the central span 132, and the width of the first lead 112 in the central span 132 can be between about 1.25 to 1.5 times the width of the first lead 112 in the outer span 134. Stated in terms of exemplary absolute values, the width of the first lead 112 in the interior span 130 can be between about 2.5 and 3.0 mm, the width of the first lead 112 in the central span 132 can be between about 2.5 and 2.0 mm, and width of the first lead 112 in the outer span 134 can be between about 1.8 and 2.2 mm. In this context, the width of the first lead 112 is a separation distance between the inner and outer edge sides 136, 138 of the second lead 112 measured along a line which crosses inner and outer edge sides 136, 138 of the first lead 112 at the same separation distance from the interior end 120 of the first lead 112.

According to an embodiment, the inner edge side 136 of the first lead 112 has an undulating profile. The inner edge side 136 of the first lead 112 faces the second lead 114 and extends from the die pad 108 to the peripheral structure 122. The undulating profile of the inner edge side 136 is such that the nearest surface of the first lead 112 moves away from the second lead 114 as the first lead 112 approaches the peripheral structure 122. Specifically, the inner edge side 136 of the first lead 112 is closer to the second lead 114 in the interior span 130 of the first lead 112 than in the central span 132 of the first lead 112, and is closer to the second lead 114 in the central span 132 of the first lead 112 than in the outer span 134 of the first lead 112. In the depicted embodiment, the inner edge side 136 of the first lead 112 includes angled transitions between the interior span 130 and the central span 132 and between the central span 132 and the outer span 134. More generally, the inner edge side 136 of the first lead 112 may include abrupt or perpendicular angled and/or curved transitions between the various spans of the first lead 112.

The second lead 114 has a width that increases in a central region that is between the interior end 120 of the second lead 114 and the peripheral structure 122. The second lead 114 includes an interior span 130, a central span 132, and an outer span 134. The interior span 130 of the second lead 114 separates the central span 132 of the second lead 114 from the interior end 120 of the second lead 114, and the outer span 134 of the second lead 114 separates the central span 132 from the peripheral structure 122. A width of the second lead 114 is greater in the central span 132 than the width of the second lead 114 in the interior span 130. Moreover, the width of the second lead 114 is greater in the central span 132 than the width of the second lead 114 in the outer span 134. The width of the second lead 114 is measured between inner and outer edge sides 136, 138 of the second lead 114. The inner and outer edge sides 136, 138 of the second lead 114 each extend from the interior end 120 of the second lead 114 to the peripheral structure 122. In this context, the width of the second lead 114 is a separation distance between the inner and outer edge sides 136, 138 of the second lead 114 measured along a line which crosses inner and outer edge sides 136, 138 of the second lead 114 at the same separation distance from the interior end 120 of the second lead 114.

Generally speaking, the width of the second lead 114 in the central span 132 can be between about 1.25 to 1.75 times the width of the second lead 114 in both the interior span 130 of the of the second lead 114 and in the outer span 134 of the second lead 114. In these embodiments, the width of the second lead 114 in the interior span 130 need not be identical to the width of the second lead 114 in the outer span 134. For instance, the width of the second lead 114 in the interior span 130 may be between about 1.05 and 1.15 times the width of the second lead 114 in the outer span 134. Stated in terms of exemplary absolute values, the width of the second lead 114 in the central span 132 can be between about 1.9 and 2.0 mm (millimeters), the width of the second lead 114 in the interior span 130 can be between about 1.3 and 1.4 mm, and the width of the second lead 114 in the outer span 134 can be between about 1.15 and 1.25 mm.

According to an embodiment, the inner edge side 136 of the second lead 114 has an undulating profile. The inner edge side 136 of the second lead 114 faces the first lead 112 and extends from the die pad 108 to the peripheral structure 122. The inner edge side 136 of the second lead 114 undulates such that the inner edge side 136 of the second lead 114 is closer to the first lead 112 in the central span 132 of the second lead 114 than in the interior and outer spans 130, 134 of the second lead 114. In an embodiment, the inner edge side 136 of the second lead 114 includes a central edge 140, which is a closest surface of the first lead 112 to the second lead 114, and first and second angled edges 142 that transition from the central edge 140 to the narrower portions of the second lead 114. The first and second angled edges 142 form angled intersections in the inner edge side 136 of the second lead 114. These angled intersections may form angles of between about 30 and 60 degrees in the inner edge side 136 of the second lead 114, for example. More generally, the increased width of the central span 132 can be obtained by any undulating profile in the inner edge side 136 of the second lead 114 which produces a wing-shaped feature extending towards the first lead 112. The undulating profile may include curved surfaces, for example.

The third lead 116 is an interior lead that is immediately adjacent to the second lead 114 and has a shifted geometry. This shifted geometry accommodates the widening of the second lead 112 while maintaining minimum separation distance between the second and third leads 114, 116. To this end, the third lead 116 includes an angled span 144 disposed between an interior span 130 and an outer span 134 of the third lead 116. The interior span 130 of the third lead 116 separates the angled span 144 from the interior end 120 of the third lead 116. Likewise, the outer span 134 of the third lead 116 separates the angled span 144 from the peripheral structure 122. The angled span 144 is disposed closer to the die pad 108 than the central span 132 of the second lead 114. This means that a closet portion of the angled span 144 to the die pad 108 is closer than a closest portion of the central span 132 of the second lead 114 to the die pad 108. The angled span 144 shifts the third lead 116 away from the second lead 114. The geometry of the angled span 144 may mirror that of the central span 132 of the second lead 114 to maintain minimum separation distance between the two leads. For instance, an edge side 146 of the third lead 116 which faces the second lead 114 may have the same orientation as the first angled edge 142 of the second lead 114 such that these two edges are parallel to one another.

According to an embodiment, an angled width of the third lead 116 in the angled span 144 is the same or substantially close to the width of the third lead 116 in the interior span 130 of the third lead 116 and/or the outer span 134 of the third lead 116. For example, the angled width of the third lead 116 in the angled span 144 may be no greater than 1.5 times the greater of the width of the third lead 116 in the interior span 130 and the width of the third lead 116 and the outer span 134. In a preferred embodiment, the angled width of the third lead 116 is between about 1.1 and 1.3 times the width of the third lead 116 in the interior span 130. Stated in terms of exemplary absolute values, the angled width of the third lead 116 can be between about 1.55 mm and 1.65 mm, the width of the third lead 116 in the interior span 130 can be between about 1.3 and 1.4 mm, and the width of the third lead 116 in the outer span 134 can be between about 1.15 and 1.25 mm. In this context, the angled width of the third lead 116 in the angled span 144 is a separation distance between the edge sides 146 of the third lead 116 measured along a line which is perpendicular to the edge sides 146 of the third lead 116 in the angled span 144, and the width of the third lead 116 in the inner and outer spans 130, 134 is a separation distance between the edge sides 146 of the third lead 116 measured along a line which crosses the outer edge sides 146 of the third lead 116 at the same separation distance from the interior end 120 of the third lead 116.

The lead frame assembly 100 is used to form a packaged semiconductor device in the following way. Initially, the semiconductor dies 104 are mounted on the die pad 108 using a conductive adhesive, e.g., solder, sinter, conductive glue, etc. Subsequently, a wire bonding process is performed to electrically connect the various leads of the lead frame 102 to the various terminals of the semiconductor dies 104. Subsequently, an encapsulation process is performed to encapsulate the semiconductor die and associated electrical connections between the terminals of the semiconductor dies 104 and the leads. The encapsulant body can be formed by a molding process such injection molding, transfer molding, compression molding, etc. After performing the encapsulation process, a lead trimming process is performed. The lead trimming process separates each of the leads from the peripheral structure 122 along the cutting line 148 shown in FIG. 1.

Figure 2:
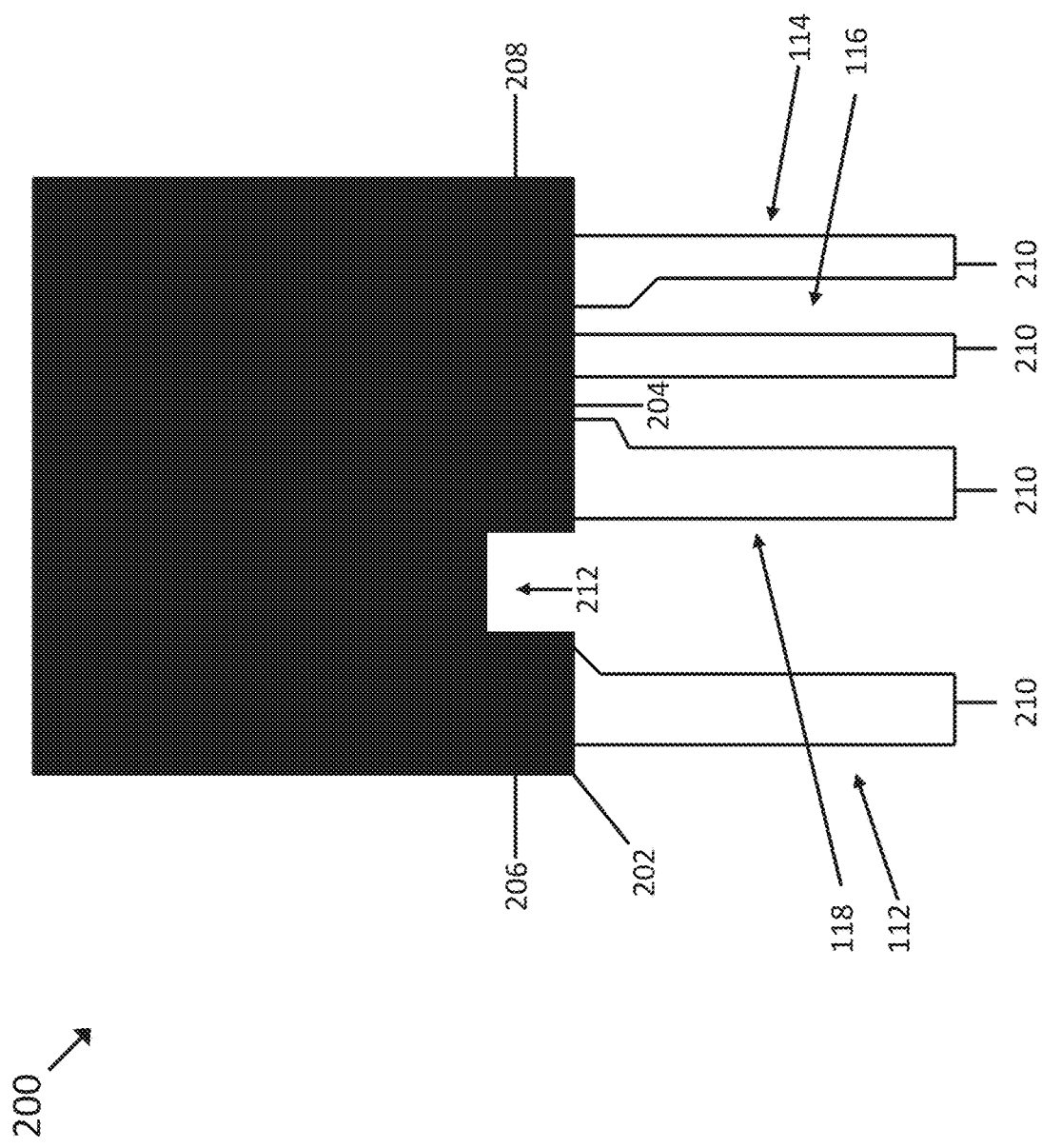
FIG. 2 illustrates a semiconductor package, according to an embodiment.

Referring to FIG. 2, a semiconductor package 200 that is formed using the lead-frame assembly of FIG. 1 is depicted, according to an embodiment. The semiconductor package 200 includes an encapsulant body 202 of electrically insulating mold compound. The encapsulant body 202 can include electrically insulating materials such as ceramics, epoxy materials and thermosetting plastics, to name a few. The encapsulant body 202 includes a first outer face 204 that extends between opposite facing second and third outer faces 206, 208. Each of the first, second, third and fourth leads 112, 114, 116, 118 protrudes out of the first outer face 204. Moreover, each of the first, second, third and fourth leads 112, 114, 116, 118 includes a distal end 210 that is opposite from the die pad 108. These distal ends 210 are formed by the lead trimming process as described above.

According to an embodiment, the first and fourth leads 112, 118 are configured as voltage blocking terminals by virtue of the above discussed electrical connections to the corresponding terminals of the semiconductor dies 104. A voltage blocking terminal refers to a device terminal to which an operating voltage is applied across. For example, in the case that the semiconductor dies 104 are configured as MOSFETs, the first and fourth leads 112, 118 can be the drain and source terminals of the device. Along similar lines, the second lead 114 may be configured as a control terminal (e.g., a gate) and the third lead 116 may be configured as a sensing terminal (e.g., source sense, temperature sense, etc.) by virtue of the above discussed electrical connections to the corresponding terminals of the semiconductor dies 104.

The encapsulant body 202 is formed to include an indentation 212 in the first outer face 204. The indentation 212 is a feature which increases the creepage, i.e., length along the encapsulant material, between the first and fourth leads 112, 118, i.e., the voltage blocking terminals of the device. Generally speaking, the indentation 212 is configured to have as much surface length as possible. Instead of the rectangular-shaped configuration shown in the depicted embodiment, the indentation 212 may include curved surfaces and/or obtuse angles.

The lead configuration of the semiconductor package 200 enables an advantageously high creepage and clearance between the first and fourth leads 112, 118, which form the voltage blocking terminals of the device. The lead configuration of the semiconductor package 200 allows for increased separation between the first and fourth leads 112, 118, both within the encapsulant body 202 and at the location wherein the first and fourth leads 112, 118 protrude from the first outer face 204 of the encapsulant body 202. This enables an increase in the straight-line distance between the first and fourth leads 112, 118 and enables a larger sized indentation 212.

The configuration of the second and third leads 114, 116 allows for increased separation between the first and fourth leads 112, 118 by enabling a thinning of the second and third leads 114, 116 without impacting the integrity of the wire bond connections. One problem with reducing the width of a package lead is that thinner leads have a greater tendency to vibrate during the wire bonding process. This is particularly problematic in the case that two separate wire bonds are made to a single package lead, as is the case for the second and third leads 114, 116 in the above embodiments. In that case, the vibration of the lead can disrupt and detach the first-formed wire bond when forming the subsequent wire bond. The multi-width configuration of the second and third leads 114, 116 produces greater stabilization for the wire bonding tool to grasp these lead and mitigate vibration. The angled span 144 of the third lead 116 accommodates the widened the central span 132 of the second lead 114 while also providing a locally wider portion in the third lead 116 to mitigate lead vibration. However, the inventors have observed that widening the angled span 144 the third lead 116 too much causes unwanted mechanical weakness at the transition between the outer span 134 of the third lead 116 and the angled span 144 of the third lead 116. Generally speaking, keeping the angled width of the angled span 144 to be the same or substantially close to the width of the third lead 116 in other regions, e.g., no greater than 1.5 times the width of the third lead 116 in the outer span 134 and/or the interior span 130, maintains acceptable mechanical strength. Collectively, the geometries of the second and third leads 114, 116 allows for narrowing of the interior spans 130 of these leads, which enables shifting of both leads away from the first lead 110, thereby improving creepage and clearance.

The lead configuration of the first lead 112 enables the advantageously high creepage and clearance by allowing for a larger separation distance between the first and fourth leads 112, 118 while maintaining adequate mechanical support of the die pad 108. As the first lead 112 is directly connected to the die pad 108, it provides some or all of the mechanical support to the die pad 108 during the assembly process. By forming the first lead 112 with a tapered width, and particularly by configuring the interior span 130 of the first lead 112 as the widest portion of the lead, the first lead 112 provides enhanced mechanical support to the die pad 108 in comparison to a uniform or decreased width configuration in this portion of the lead. Thus, the die pad 108 remains mechanically stable during die attach, wire bonding, encapsulation, etc., thereby mitigating the possibility of detachment or failure of the various elements. Meanwhile, by gradually narrowing and shifting away from the fourth lead 118 as the first lead 112 moves away from the die pad 108, a greater separation distance between the first and fourth leads 110, 118 is produced, and a larger sized indentation 212 is possible.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A lead frame, comprising:
   a die pad comprising a die attach surface;
   a row of two or more leads that extend away from a first side of the die pad; and
   a peripheral structure disposed opposite the first side of the die pad and connected to each lead from the row of two or more leads,
   wherein a first lead that is an outermost lead of the row is continuously connected to the first side of the die pad,
   wherein a second lead that is an outermost lead of the row comprises an interior end that faces and is spaced apart from the first side of the die pad,
   wherein a width of the second lead in a central span of the second lead is greater than the width of the second lead in an interior span of the second lead and in an outer span of the second lead, the interior span of the second lead separating the central span of the second lead from the interior end of the second lead, the outer span of the second lead separating the central span of the second lead from the peripheral structure.

2. The lead frame of claim 1, wherein the second lead comprises an inner edge side that faces the first lead and extends from the interior end of the second lead to the peripheral structure, wherein the inner edge side of the second lead is closer to the first lead in the central span of the second lead than in the interior and outer spans of the second lead.

3. The lead frame of claim 2, wherein in the central span of the second lead, the inner edge side of the second lead comprises a central edge and first and second angled edges, and wherein the central edge of the second lead is a closest surface of the second lead to the first lead.

4. The lead frame of claim 2, wherein the row of leads comprises a third lead that is immediately adjacent to the second lead and comprises an interior end that faces and is spaced apart from the first side of the die pad, wherein the third lead comprises an angled span disposed between interior and outer spans of the third lead, the interior span of the third lead separating the angled span from the interior end of the third lead, wherein the angled span is disposed closer to the die pad than the central span of the second lead, and wherein the angled span shifts the third lead away from the second lead.

5. The lead frame of claim 4, wherein an angled width of the third lead in the angled span is no greater than 1.5 times the width of the third lead in the interior span, the angled width being measured in a direction that is perpendicular an outer edge side of the third lead in the angled span.

6. The lead frame of claim 1, wherein a width of the first lead tapers incrementally moving from the die pad towards the peripheral structure.

7. The lead frame of claim 6, wherein the first lead comprises an interior span, a central span, and an outer span, the interior span of the first lead separating the central span of the first lead from the die pad, the outer span of the first lead separating the central span of the first lead from the distal end of the first lead, wherein the interior span of the first lead is wider than the central span of the first lead, and wherein the central span of the first lead is wider than the outer span of the first lead.

8. The lead frame of claim 7, wherein the first lead comprises an inner edge side that faces the second lead and extends from the die pad to the peripheral structure, wherein the inner edge side of the first lead is closer to the second lead in the interior span of the first led than in the central span of the first lead, and wherein the inner edge side of the first lead is closer to the second lead in the central span of the first lead than in the outer span of the first lead.

9. A semiconductor package, comprising:
   a die pad comprising a die attach surface;
   a first semiconductor die mounted on the die attach surface;
   an encapsulant body of electrically insulating mold compound that encapsulates the first semiconductor die and comprises first, second and third outer faces, the first outer face extending between the second and third outer faces; and
   a row of two or more leads that extend away from a first side of the die pad and protrude out of the first outer face,
   wherein a first lead that is an outermost lead of the row is continuously connected to the first side of the die pad,
   wherein a second lead that is an outermost lead of the row comprises an interior end that faces and is spaced apart from the first side of the die pad,
   wherein a width of the second lead in a central span of the second lead is greater than the width of the second lead in an interior span of the second lead and in an outer span of the second lead, the interior span of the second lead separating the central span of the second lead from the interior end of the second lead, the outer span of the second lead separating the central span of the second lead from a distal end of the second lead.

10. The semiconductor package of claim 9, wherein the second lead comprises an inner edge side that faces the first lead and extends from the interior end to the distal end of the second lead, wherein the inner edge side of the second lead is closer to the first lead in the central span of the second lead than in the interior and outer spans of the second lead.

11. The semiconductor package of claim 10, wherein in the central span of the second lead, the inner edge side of the second lead comprises a central edge and first and second angled edges, and wherein the central edge of the second lead is a closest surface of the second lead to the first lead.

12. The semiconductor package of claim 11, wherein the row of leads comprises a third lead that is immediately adjacent to the second lead and comprises an interior end that faces and is spaced apart from the first side of the die pad, wherein the third lead comprises an angled span disposed between an interior span and an outer span of the third lead, the interior span of the third lead separating the angled span from the interior end of the third lead, and wherein the angled span is disposed closer to the die pad than the central span of the second lead, and wherein the angled span shifts the third lead away from the second lead.

13. The semiconductor package of claim 9, wherein the semiconductor package further comprises first and second bond wires, wherein both of the first and second bond wires are electrically connected to the second lead.

14. The semiconductor package of claim 13, wherein the semiconductor package further comprises a second semiconductor die mounted on the die attach surface, wherein the first bond wire electrically connects the second lead to the first semiconductor die, and wherein the second bond wire electrically connects the second lead to the second semiconductor die.

15. The semiconductor package of claim 14, wherein each of the first and second semiconductor dies is configured as a power transistor, and wherein the second lead is configured as a control terminal of the semiconductor package.

16. The semiconductor package of claim 15, wherein the row of two or more leads comprises a third lead that protrudes out of the first outer wall and is immediately adjacent to the second lead, and wherein the third lead is configured as a sensing terminal of the semiconductor package.

17. The semiconductor package of claim 15, wherein the row of two or more leads comprises a fourth lead that protrudes out of the first outer wall and is immediately adjacent to the first lead, wherein the first and fourth leads are configured as voltage blocking terminals of the semiconductor package, and wherein the encapsulant body further comprises an indentation in the first outer wall between the first and fourth leads.

18. A semiconductor package, comprising:
a die pad comprising a die attach surface;
a first semiconductor die mounted on the die attach surface;
an encapsulant body of electrically insulating mold compound that encapsulates the first semiconductor die and comprises first, second and third outer faces, the first outer face extending between the second and third outer faces; and
a row of two or more leads that extend away from a first side of the die pad and protrude out of the first outer face,
wherein a first lead that is an outermost lead of the row is continuously connected to the first side of the die pad,
wherein a second lead that is an outermost lead of the row comprises an interior end that faces and is spaced apart from the first side of the die pad,
wherein a width of the first lead tapers incrementally moving from the die pad towards a distal end of the first lead.

19. The semiconductor package of claim 18, wherein the first lead comprises an interior span, a central span, and an outer span, the interior span of the first lead separating the central span of the first lead from the die pad, the outer span of the first lead separating the central span of the first lead from the distal end of the first lead, wherein the interior span of the first lead is wider than the central span of the first lead, and wherein the central span of the first lead is wider than the outer span of the first lead.

20. The semiconductor package of claim 19, wherein the first lead comprises an inner edge side that faces the second lead and extends from the die pad to the peripheral structure, wherein the inner edge side of the first lead is closer to the second lead in the interior span of the first lead than in the central span of the first lead, and wherein the inner edge side of the first lead is closer to the second lead in the central span of the first lead than in the outer span of the first lead.

* * * * *